(12) United States Patent
Shibata et al.

(10) Patent No.: US 8,304,804 B2
(45) Date of Patent: Nov. 6, 2012

(54) SEMICONDUCTOR DEVICE

(75) Inventors: Hajime Shibata, Ibaraki (JP); Hitoshi Tampo, Ibaraki (JP); Koji Matsubara, Ibaraki (JP); Akimasa Yamada, Ibaraki (JP); Keiichiro Sakurai, Ibaraki (JP); Shogo Ishizuka, Ibaraki (JP); Shigeru Niki, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 332 days.

(21) Appl. No.: 12/601,248

(22) PCT Filed: May 13, 2008

(86) PCT No.: PCT/JP2008/058781
§ 371 (c)(1),
(2), (4) Date: Nov. 20, 2009

(87) PCT Pub. No.: WO2008/143066
PCT Pub. Date: Nov. 27, 2008

(65) Prior Publication Data
US 2010/0163864 A1 Jul. 1, 2010

(30) Foreign Application Priority Data
May 23, 2007 (JP) .................. 2007-136859

(51) Int. Cl.
*H01L 33/00* (2010.01)
(52) U.S. Cl. .......... 257/103; 257/94; 257/101; 257/200; 257/E33.001
(58) Field of Classification Search .............. 257/94, 257/101, 103, 200
See application file for complete search history.

(56) References Cited

U.S. PATENT DOCUMENTS
2006/0220029 A1* 10/2006 Ishikazi ............... 257/79
(Continued)

FOREIGN PATENT DOCUMENTS
JP 2004-193270 7/2004
(Continued)

OTHER PUBLICATIONS

International Search Report dated Jun. 10, 2008f or PCT/JP2008/058781, published Nov. 27, 2008 (English Language Translation)—2 pages.

(Continued)

*Primary Examiner* — Wai Sing Louie
(74) *Attorney, Agent, or Firm* — Fish & Richardson P.C.

(57) ABSTRACT

An object of the present invention is to increase the light emission efficiency of a ZnO-based optical semiconductor device. An optical semiconductor device B has a structure which includes n-type $Zn_{1-z}Mg_zO$ (barrier layer) 11/$Zn_{1-x}Mg_xO$ (active layer) 15/p-type $Zn_{1-y}Mg_yO$ (barrier layer) 17, and light is emitted from the active layer 15. Electrodes 23, 21 are respectively formed on barrier layers 11, 17. By applying a voltage between the two electrodes 23, 21, light is emitted from ZnO (active layer) 15. Here, there are a relationship of x<y and a relationship of x<z. For instance, such values as x=0.1, y=0.15 and z=0.16 can be chosen. Otherwise, such values as x=0.15, y=0.25 and z=0.24 can be choose as well. In this case, by increasing the value x of the active layer, it is possible to shift its light emission wavelength to the shorter wavelength side. In addition, as shown in the above-described results, by increasing the value x, it is possible to enhance its light emission efficiency. For this reason, the optical semiconductor device is excellent as a light-emitting device.

15 Claims, 7 Drawing Sheets

U.S. PATENT DOCUMENTS

2006/0255351 A1* 11/2006 Ryu et al. .................. 257/96
2007/0228390 A1* 10/2007 Hattori et al. ............... 257/79

FOREIGN PATENT DOCUMENTS

| | | |
|---|---|---|
| JP | 2004-296796 | 10/2004 |
| JP | 2005-243955 | 9/2005 |
| JP | 2006-086142 | 3/2006 |
| JP | 2007-059667 | 3/2007 |
| JP | 2007-123938 | 5/2007 |

OTHER PUBLICATIONS

Japanese Patent Office, Written Opinion dated Jun. 10, 2008 for PCT/JP2008/058781, published Nov. 27, 2008, and accompanying English language translation (6 pages).

* cited by examiner

| Sample | ZnO | x=0.05 | x=0.11 | x=0.15 |
|---|---|---|---|---|
| Relative intensity ratio at T=1.4K | — | 1.00 | 1.44 | 2.26 |
| Energy width of light emission band | Minute | Small | Moderate | Large |
| Temperature satisfying I(T)/I(O)=1/2 | 17 K | 32 K | 66 K | 115 K |
| Value of k in the formula: I is proportional to $L^k$ | 1.01 | 1.27 | 1.05 | 1.03 |
| Activation energy in non-radiative recombination process | 10 meV | 14 meV | 34 meV | 78 meV |

US 8,304,804 B2

SEMICONDUCTOR DEVICE

REFERENCE TO RELATED APPLICATIONS

This application is a national stage application of and claims the benefit of PCT Application No. PCT/JP2008/058781 filed on May 13, 2008. PCT Application No. PCT/JP2008/058781 filed on May 13, 2008 claims the benefit of Japanese Patent Application No. 2007-136859 filed on May 23, 2007. The disclosures of the above referenced prior applications are considered part of (and are incorporated by reference in) the disclosure of this application.

TECHNICAL FIELD

The present invention relates to a semiconductor device, particularly made of II-VI group semiconductors based on ZnO or the like.

BACKGROUND ART

In recent years, realization of an ultraviolet light-emitting diode has been very strongly desired in the industrial field as a breakthrough following the blue light-emitting diode. That is because a shorter light emission wavelength leads to expectation of various new functions such as enhancement of optical recording density and excitation of a white light-emitting fluorescent material.

As a promising candidate for a material enabling t to realize the ultraviolet light-emitting semiconductor device, ZnO has heretofore attracted attention and has been studied extensively all over the world.

Non-patent Document 1: Ohtomo et al., APL72, 2466 (1998)

DISCLOSURE OF THE INVENTION

Problems to be Solve by the Invention

As a promising candidate for a material enabling to realize the ultraviolet light-emitting semiconductor device, ZnO has heretofore attracted attention and has been studied extensively all over the world. FIG. 10 shows a structure of a light-emitting device using ZnO and $Zn_{1-z}Mg_zO$, which any researcher who has seen a result of Non-patent Document 1 can easily come up with. This light-emitting device structure D is a structure which includes n-type $Zn_{1-z}Mg_zO$ (barrier layer) 101/ZnO (active layer) 103/p-type $Zn_{1-x}Mg_xO$ (barrier layer) 105, and light is emitted from the active layer 103. Electrodes 111, 107 are respectively formed on the barrier layers 101, 105. By applying a voltage between the two electrodes 111, 107, light is emitted from ZnO (active layer) 103. FIG. 11 is a diagram included in Non-patent Document 1, and shows wavelength dependence of PL intensity which was observed in a $Zn_{1-x}Mg_xO$ thin film. It is obvious that the bandgap width of $Zn_{1-x}Mg_xO$ increases as x increases, as shown in the diagram.

Conventional semiconductors including a gallium nitride-based material practically used for a blue light-emitting diode, have such a common property that the light emission efficiency decreases when the light emission wavelength is changed to the shorter wavelength side. ZnO similarly has no particular reason to be expected to have a property beyond the nature of the conventional semiconductors.

An object of the present invention is to increase the light emission efficiency of a ZnO-based optical semiconductor device.

Means for Solving the Problem

In the case of $Zn_{1-x}Mg_xO$ obtained by mixing Mg with ZnO, its light emission wavelength changes to a shorter wavelength as the Mg concentration increases. In the case of excellent-quality, single-crystal $Zn_{1-x}Mg_xO$, its light emission efficiency also increases as the Mg concentration increases. For this reason, $Zn_{1-x}Mg_xO$ is suitable for an active layer of a light-emitting device. Specifically, from a viewpoint of the present invention, a light-emitting device characterized in that single-crystal $Zn_{1-x}Mg_xO$ (x>0) is used for an active layer is provided. Here, $Zn_{1-y}Mg_yO$ (y>x) may be used for a barrier layer for the active layer. Alternatively, $Zn_{1-y}Mg_yO$ (y>x), or $Zn_{1-y}Mg_yO$ (y>x) and $Zn_{1-z}Mg_zO$ (z>x, y and z may be unequal to each other) may be used for barrier layers sandwiching the active layer.

Otherwise, ZnS or BeO may be used for the barrier layers for the active layer.

For the above-described configuration, it is preferable that the value x should be a value from 0.05 to 0.52. It is more preferable that the value x should be a value which is not smaller than 0.11. By increasing the value x, it is possible to increase the bandgap and also to increase the light emission efficiency. In a sample, the Mg concentration is inhomogeneous from one area to another, and thus, areas with relatively high Mg concentrations and areas with relatively low Mg concentrations coexist in the sample. For this reason, excitons which work as source of light emission localize, which in turn increases the light emission efficiency of the material to a large extent. The above-described light-emitting device is chiefly a high-efficiency ultraviolet light-emitting semiconductor device. BeO is conceivable as a material, other than ZnS, which can be used for the barrier layers.

Effect of the Invention

The present invention has an advantage that, by increasing the value x in $Zn_{1-x}Mg_xO$, it is possible to increase the light emission efficiency of the optical semiconductor device using $Zn_{1-x}Mg_xO$ as a light-emitting material. Accordingly, by using $Zn_{1-x}Mg_xO$ for the active layer of the light-emitting device, it is possible to enhance the performance of the device.

EXPLANATION OF REFERENCE SIGNS

A, B, C, D . . . optical semiconductor device with a mutually-different composition
11 . . . n-type $Zn_{1-y}Mg_yO$ (barrier layer)
15 . . . $Zn_{1-x}Mg_xO$ (active layer)
17 . . . p-type $Zn_{1-y}Mg_yO$ (barrier layer)
21, 23 . . . electrodes

BEST MODES FOR CARRYING OUT THE INVENTION

ZnO has no particular reason to be expected to have a property beyond the nature of the conventional semiconductors. However, the inventors have found that, in the case of a material obtained by adding Mg in an amount of several percents to tens percents to ZnO, increase in the concentration of Mg (a value x of Mg) not only changes the light emission wavelength to the shorter wavelength side as have heretofore been said, but also increases the light emission efficiency remarkably. The increase in the light emission efficiency is contrary to a conventional common sense. Accordingly, the inventors have thought about use of $Zn_{1-x}Mg_xO$ for the active layer.

Figure 1:
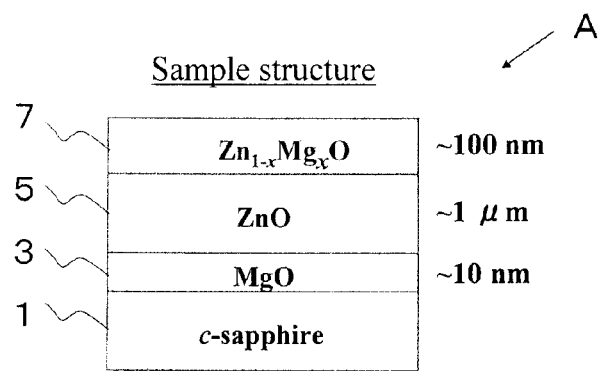
FIG. 1 is a diagram showing an instance of a configuration of an optical semiconductor device structure according to an embodiment of the present invention.

Descriptions will be hereinbelow provided for an optical semiconductor device structure according to an embodiment of the present invention, referring to the drawings. FIG. 1 is a diagram showing an instance of a configuration of the optical semiconductor structure according to the present embodiment. As shown in FIG. 1, a buffer layers (a MgO layer 3 and a ZnO layer 5) are formed on a sapphire substrate 1 whose principal plane is the c-plane by radical source-molecular beam epitaxy (hereinafter referred to as a "RS-MBE" method). An optical semiconductor layer 7 made of single-crystal $Zn_{1-x}Mg_xO$ is formed on the buffer layers. Raw material sources, growth conditions and the like are as follows, although exemplified.

Zn (purity=7N): evaporation source temperature=310° C.
Mg (purity=6N): evaporation source temperature=400 to 500° C.
$O_2$ (purity=6N): gas flow rate=1.5 SCCM
RF Power: 300 W
Substrate temperature: 550° C. ($Zn_{1-x}Mg_xO$), 650° C. (ZnO)

Samples having Mg concentrations (molar ratios x) respectively of 0.05, 0.11, and 0.15 were prepared, and their properties were evaluated as well. In addition, experiments up to x=0.52 were additionally conducted. One advantage of the RS-MBE method is that single crystals of a grown thin film are very high in chemical purity. The RS-MBE method is a technique in which: a substrate material is placed in an ultra-high vacuum chamber; vapor (molecular beams) of source elements constituting a material for crystals intended to be grown is injected onto the substrate material in vacuum; and thereby thin-film single crystals are grown. As the source material, ultra-high-purity zinc and ultra-high-purity Mg were prepared, and oxygen radicals were used as an oxygen source.

Figure 2:
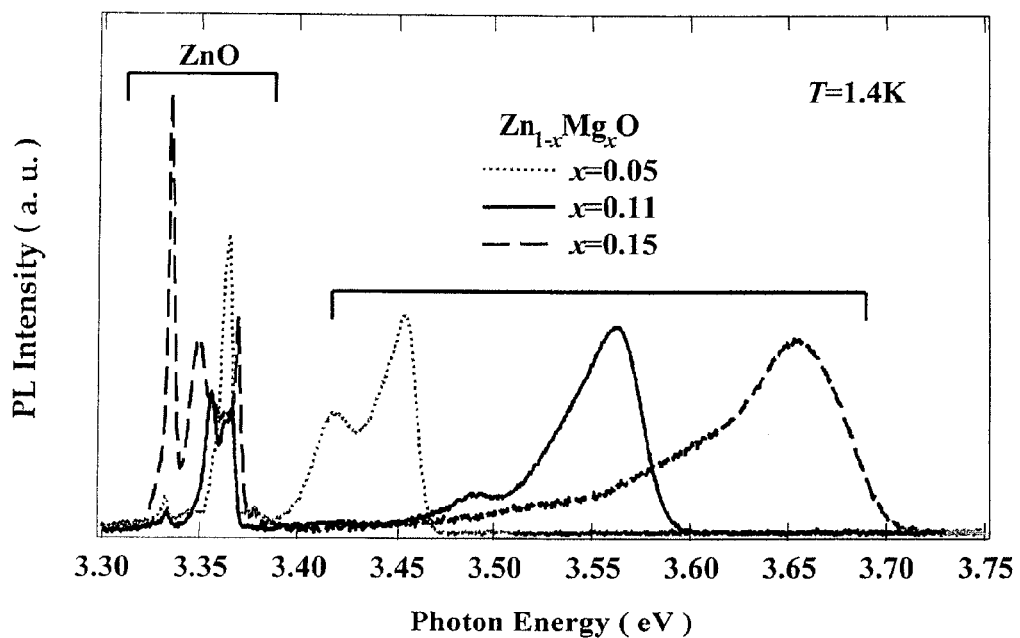
FIG. 2 is a diagram showing photon-energy (corresponding to a light emission wavelength) dependence of PL intensity observed in an semiconductor $Zn_{1-x}Mg_xO$.

FIG. 2 is a diagram showing photon-energy (corresponding to the light emission wavelength) dependence of PL intensity which is observed in the optical semiconductor layer 7 made of $Zn_{1-x}Mg_xO$. The measurement temperature was 1.4K. The diagram shows PL spectra which respectively correspond to x=0.05, 0.11 and 0.15 in the case of $Zn_{1-x}Mg_xO$. As clear from FIG. 2, as the Mg concentration x increases, the band of light emission from $Zn_{1-x}Mg_xO$ at T=1.4K exhibits the following properties.

(1) The peak position shifts to the higher energy side (the shift corresponds to the increase in the handgap).

(2) The bandwidth increases (it is inferred to be caused due to spatial inhomogeneity of the Mg concentration).

(3) The peak light emission intensity (integrated intensity) increases (it is inferred to be caused due to increase in the oscillator strength).

Particularly, the increase in the peak integrated intensity in conjunction with the increase in the Mg concentration which is mentioned in (3) is a phenomenon which has been newly found. Note that in the inventors' experiment, it was found that this phenomenon was seen until the value x increases up to x=0.52 approximately. Having developed the technique for growing $Zn_{1-x}Mg_xO$ crystals with an excellent quality by using the single-crystal thin film growing technique known as the RS-MBE method, the inventors have revealed the true potential of $Zn_{1-x}Mg_xO$, which had been overlooked before, for the first time ever.

Figure 3:
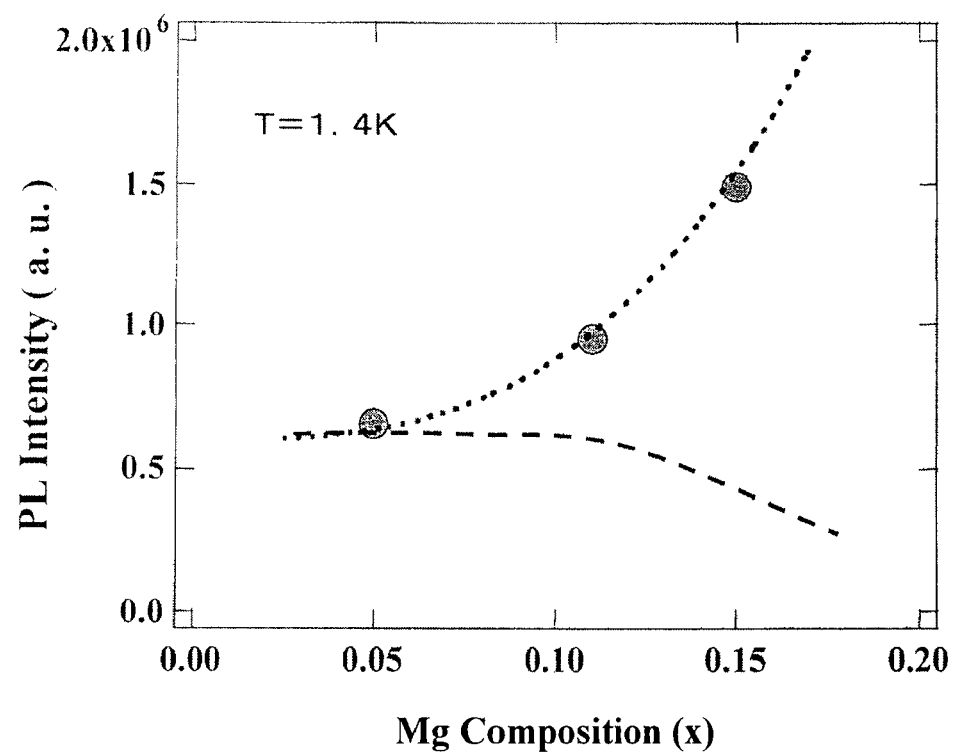
FIG. 3 is a diagram showing a relationship between the Mg concentration and the PL intensity. The closed circles are experimental results.

FIG. 3 is a diagram showing a relationship between the Mg concentration and the PL intensity. As shown in FIG. 3, what has been heretofore anticipated is that the integrated PL intensity decreases as the Mg concentration increases as indicated by a broken line in the drawing. However, it is in fact found that the integrated PL intensity remarkably increases with increasing Mg composition x is lager than 0.1 as indicated by dotted line and closed circles. The following two points are conceivable factors which can account for this phenomenon.)

(1) Increase in crystal-lattice deficiency which constitutes radiative recombination centers (inducing DAP luminescence and D0-h luminescence)

(2) Localization of excitons

Here, the DAP luminescence is a light-emitting mechanism in which light is emitted in response to transition of electrons from the donor level to the acceptor level, and the D0-h luminescence is a light-emitting mechanism in which light is emitted in response to transition of electrons from the donor level to the top of the valence band. However, the experiment result revealed that no dependence of excitation light intensity exists for the peak position of the band of light emission from $Zn_{1-x}Mg_xO$. For this reason, it is understood that the increase in the integrated PL intensity is not a phenomenon caused due to the DAP luminescence. On the other hand, from a viewpoint of a relationship (I is proportional to $L^k$) between the light intensity L of the excitation light and the PL light emission intensity I, it is understood that the increase in the integrated PL intensity is likely to be caused by light emission which occurs in the exciton recombination process (interband transition) because the value k is more than 1 (one) for any value x.

Figure 4:
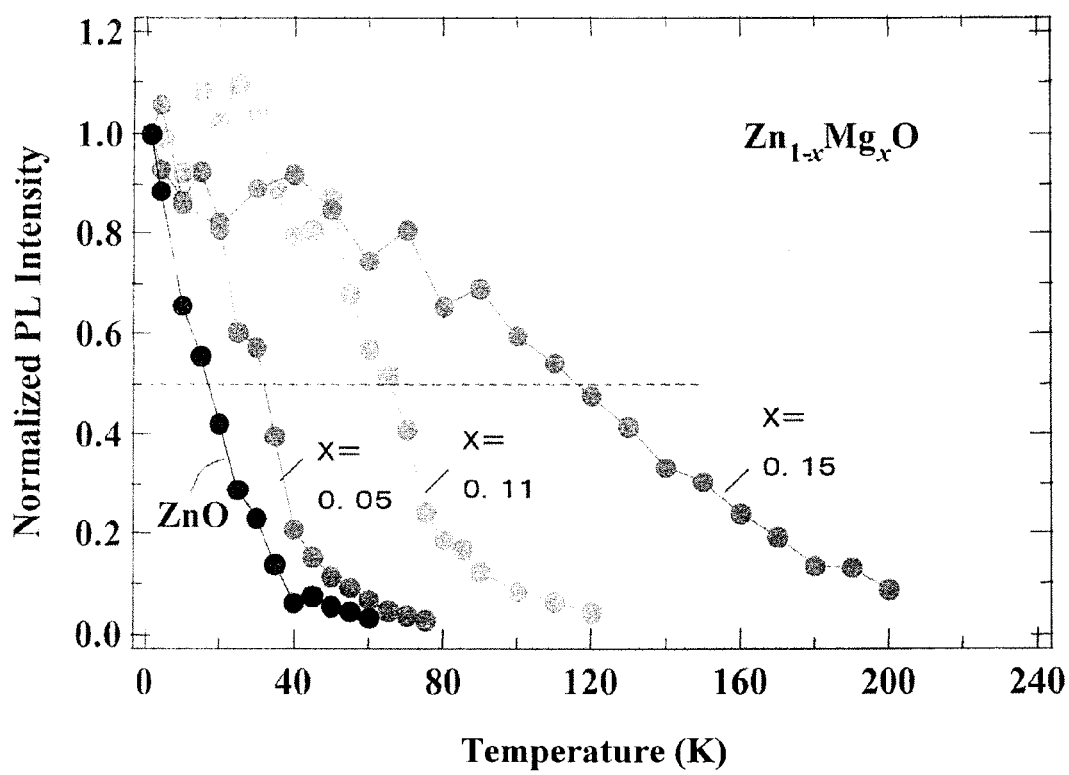
FIG. 4 is a diagram showing temperature dependence of PL light emission intensity normalized to intensity at T=1.4K.

FIG. 4 is a diagram showing temperature dependence of PL light emission intensity I(T)/I(O) normalized to intensity at T=1.4K. As the Mg concentration increases, the temperature which satisfies I(T)/I(O)=½ remarkably increases (x=0: 17K→x=0.05:32K→x=0.11:66K→x=0.15:115K). This result indicates that the temperature which satisfies I(T)/I(O)

=½ remarkably increases particularly when x≧0.05. This means that when x is large, the light emission efficiency does not decrease even at high temperature.

Figure 5:
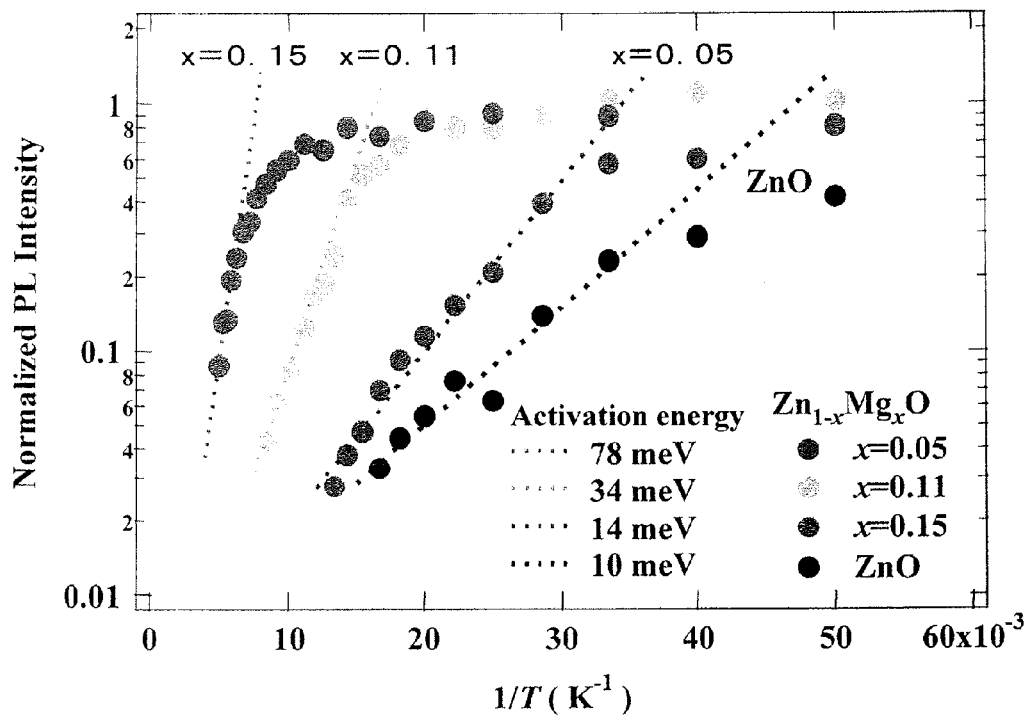
FIG. 5 is a diagram explaining the evaluation of activation energy in a non-radiative recombination process, and showing a relationship between $1/T(K^{-1})$ and the normalized PL intensity.

FIG. 5 is a diagram explaining the evaluation of activation energy in a non-radiative recombination process, and showing a relationship between $1/T(K^{-1})$ and the PL intensity $I(T)/I(O)$ normalized to intensity at T=1.4K. This figure shows that the value of the activation energy in the non-radiative recombination process increases as the Mg concentration increases. Therefore, it is suggested that a dominant mechanism which suppress the thermal quenching is the increase in the activation energy but not the decrease in the concentration of the non-radiative recombination centers. This suggests that the excitons localize.

Figure 6:
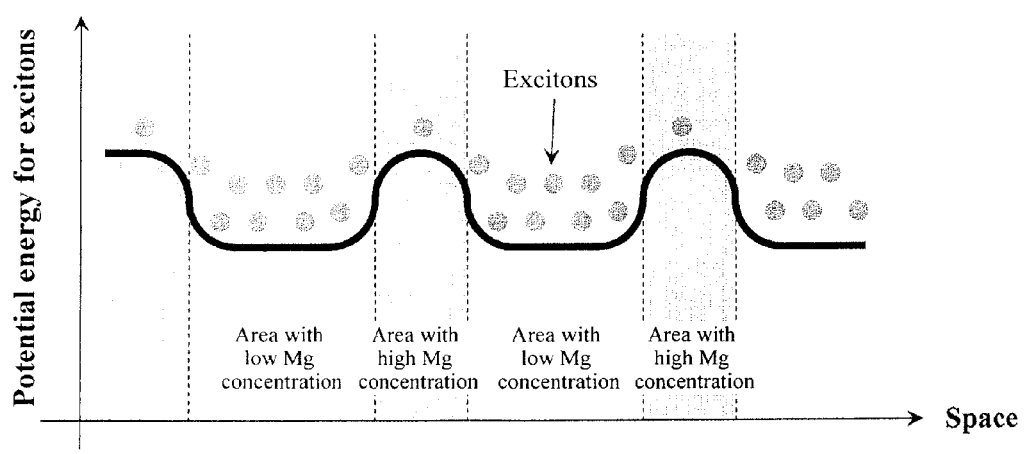
FIG. 6 is a schematic representation of an energy band diagram showing how excitons in $Zn_{1-x}Mg_xO$ which are induced due to spatial fluctuation of Mg composition localize.

FIG. 6 is a schematic representation of an energy band diagram showing how excitons localize in $Zn_{1-x}Mg_xO$ which are induced due to spatial fluctuation of Mg composition. It is conceivable that the fundamental origin of the exciton localization is the spatial fluctuation of the concentration of Mg composition. Specifically, it is inferred that: the spatial fluctuation of potential for excitons is induced; and the localization of the excitons is induced. The inventors have checked that the phenomenon is observed until the value x reached 0.52. The above-mentioned result indicates that, as shown in FIG. 6, the concentration of Mg in the sample is inhomogeneous from one area to another, and areas with relatively higher Mg concentrations and areas with relatively lower Mg concentrations coexist in the sample. Accordingly, it is inferred that: this coexistence induces the localization of the excitons which is the origin of light emission; and the localization enhances the light emission efficiency of the material to a large extent.

Example 1

Figure 7:
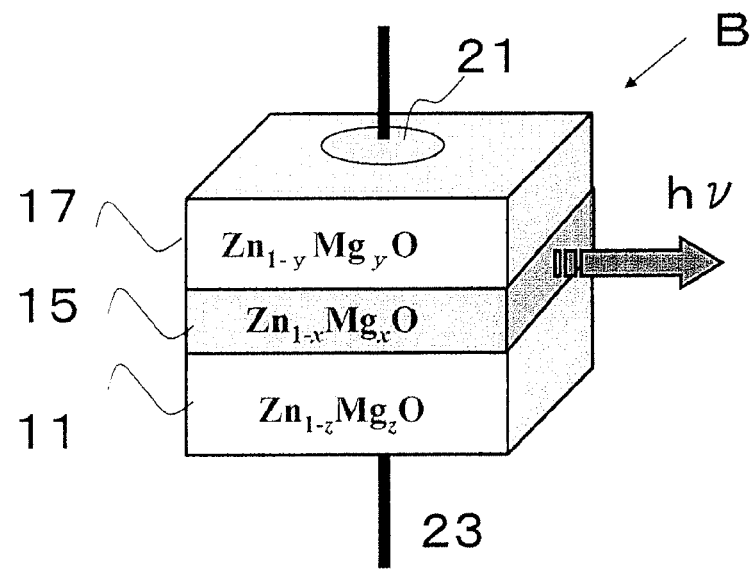
FIG. 7 is a diagram showing an instance of an optical semiconductor device according to a first example of the present invention.

Next, descriptions will be provided for a concrete example using the above-described phenomenon. FIG. 7 is a diagram showing an instance of an optical semiconductor device according to a first example of the present invention. An optical semiconductor device B shown in FIG. 7 has a structure which includes n-type $Zn_{1-z}Mg_zO$ (barrier layer) 11/$Zn_{1-x}Mg_xO$ (active layer) 15/p-type $Zn_{1-y}Mg_yO$ (barrier layer) 17, and light is emitted from the active layer 15. Electrodes 23, 21 are respectively formed on the barrier layers 11, 17. By applying a voltage between the two electrodes 23, 21, light is emitted from $Zn_{1-x}Mg_xO$ (active layer) 15. Note that there are a relationship of x<y and a relationship of x<z. For an instance, such values as x=0.1, y=0.15, z=0.17 can be chosen. Such values as x=0.15, y=0.25, z=0.24 can be chosen as well. In this case, by increasing the value x of the active layer, it is possible to shift the light emission wavelength to the shorter wavelength side. Furthermore, as shown in the above-described result, by increasing the value x, it is possible to enhance the light emission efficiency. For this reason, the optical semiconductor device according to the first example of the present invention is excellent as a light-emitting device.

Example 2

Figure 8:
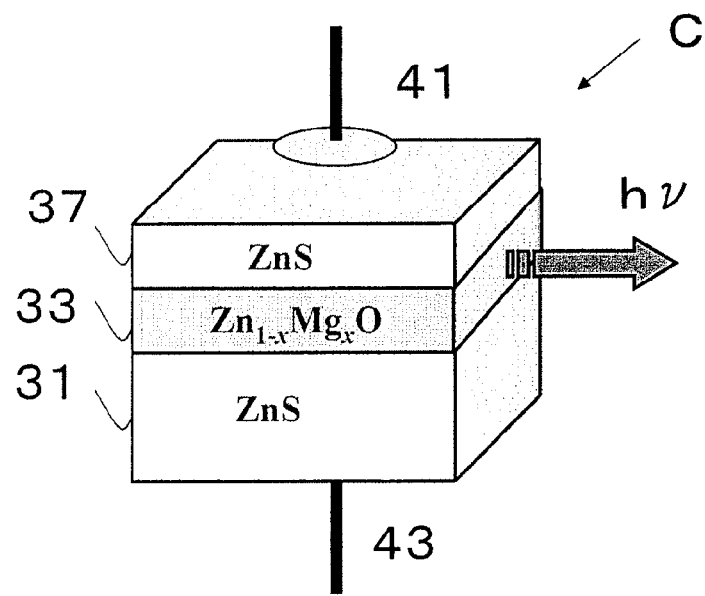
FIG. 8 is a diagram showing an instance of an optical semiconductor device according to a second example of the present invention.

FIG. 8 is a diagram showing an instance of an optical semiconductor device according a second example of the present invention. An optical semiconductor device C shown in FIG. 8 has a structure which includes n-type ZnS (barrier layer) 31/$Zn_{1-x}Mg_xO$ (active layer) 33/p-type ZnS (barrier layer) 37, and light is emitted from the active layer 33. Electrodes 43, 41 are respectively formed on the barrier layers 31, 37. By applying a voltage between the two electrodes 43, 41, light is emitted from ZnO (active layer) 33. Note that because ZnS is used for the barrier layers, such values as x=0.1, x=0.15 and y=0.25 can be chosen as the value x, for an instance. In this case, by increasing the value x of the active layer, it is possible to shift the light emission wavelength to the shorter wavelength side. Furthermore, as shown in the above-described result, by increasing the value x, it is possible to enhance the light emission efficiency. For this reason, the optical semiconductor device according to the second example of the present invention is excellent as a light-emitting device. In this manner, other II-VI group materials can be used as the barrier layers.

SUMMARY

Figures 9, 10:
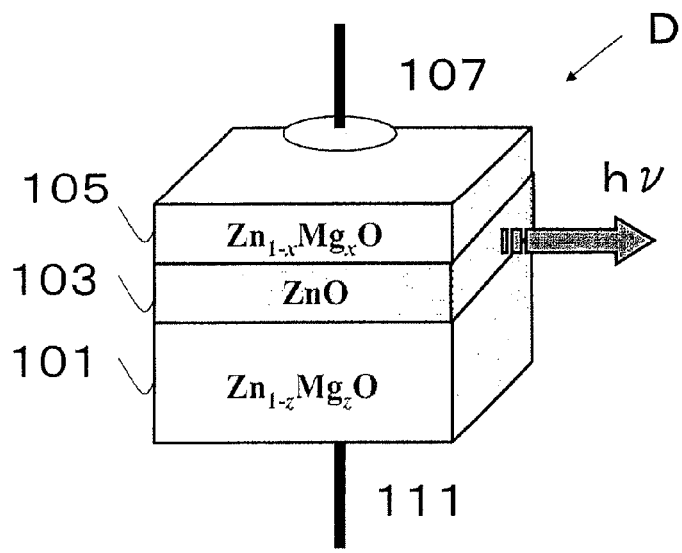
FIG. 9 is a diagram summarizing results which are obtained from the present embodiment.
FIG. 10 is a diagram showing a light-emitting device structure which is referred to in Non-patent Document 1.
Figure 11:
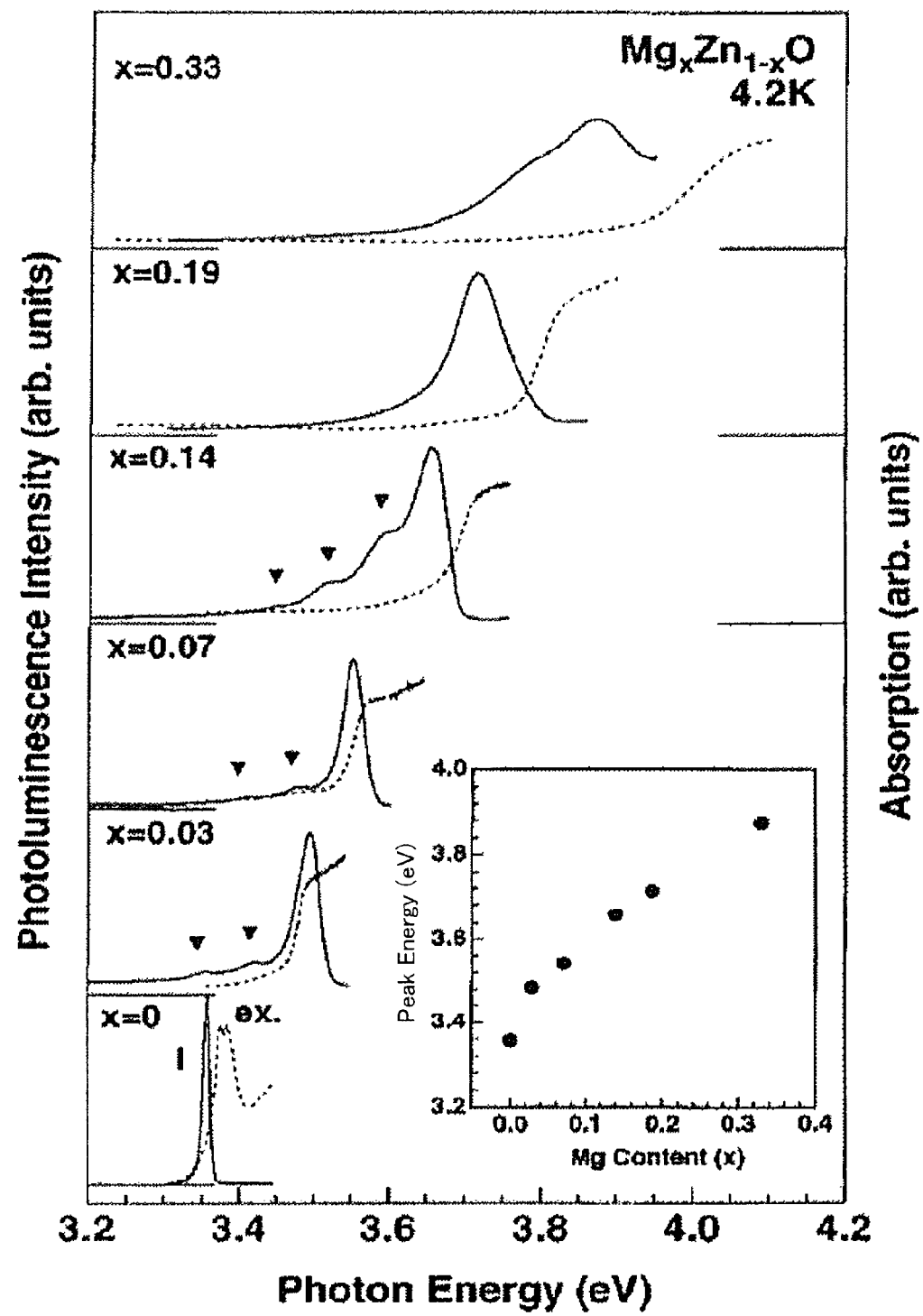
FIG. 11 is a diagram showing wavelength dependence of PL intensity as a function of Mg composition x.

FIG. 9 is a table summarizing the results which are obtained from the present invention.

(1) It is inferred that the PL light-emitting mechanism of $Zn_{1-x}Mg_xO$ is the exciton recombination process.
(2) It is inferred that the mechanism which increases the PL light emission intensity of $Zn_{1-x}Mg_xO$ is the localization of the excitons which occurs due to the spatial inhomogeneity of the Mg concentration.
(3) $Zn_{1-x}Mg_xO$ is more suitable for the active layer of the light-emitting device than ZnO. In other words, by increasing the value x, it is possible to enhance the light emission efficiency of the ZnO-based optical semiconductor device.

The results makes it possible to realize a light-emitting diode and a semiconductor laser which emit light with a very high efficiency in the ultraviolet region, as well as a high-performance light source for white illumination.

The following four elements can be enumerated as elements expected to be capable of obtaining an effect, which is similar to that of Mg, when adding the elements to ZnO. Namely, they are calcium, strontium, barium and cadmium.

In addition, the following 11 II-VI-group compound semiconductors can be enumerated as compounds expected to be capable of obtaining an effect, which is similar to that of ZnO, when adding Mg to the compounds.

They are BeS, BeSe, BeTe, ZnS, ZnSe, ZnTe, CdS, CdSe, CaTe, HgSe and HgTe.

Furthermore, the $Zn_{1-x}Mg_xO$ used for the embodiment has a very high crystal quality. For this reason, the inventors consider that the use of the material having the high crystal quality made it possible to observe the above-described fundamental property of $Zn_{1-x}Mg_xO$. As for the embodiment, the foregoing descriptions have been provided for the case where $Zn_{1-x}Mg_xO$ is used for the light-emitting device whose structure is called the "double-hetero structure," which have the active layer and the barrier layers, and which use the PN junction. However, it goes without saying that $Zn_{1-x}Mg_xO$ can be used for a light-emitting device having a different configuration. Here, examples of the light-emitting device having the different configuration include: a pn-junction light-emitting device having no double-hetero structure; a light-emitting device using no pn-junction; and the like. Moreover, examples of the light-emitting device using no pn-junction include: a light-emitting device using a Schottky junction; a device using an EL light-emitting mechanism; a light-emitting device using $Zn_{1-x}Mg_xO$ as a fluorescent material; and the like.

In addition, examples of the light-emitting device using $Zn_{1-x}Mg_xO$ as the fluorescent material include a light-emitting device for a plasma display, a field emission-type light-emitting device, a SED (surface-conduction electron-emitter) light-emitting device, and the like. Furthermore, it is a matter of course that $Zn_{1-x}Mg_xO$ can be used for a channel layer of an electron device (transistor) and the like. Moreover, ZnO is expected as a transparent conductor material which will take the part of the conventional ITO. The results of the present matter makes it possible realize a high-performance, large-area transparent conductor thin film for a solar cell and a flat-panel display.

INDUSTRIAL APPLICABILITY

The present invention is applicable to the ZnO(Mg)-based light-emitting device.

The invention claimed is:

1. A high-efficiency ultraviolet light-emitting device characterized in that single-crystal $Zn_{1-z}Mg_xO$ (x>0) is used for an active layer, $Zn_{1-y}Mg_yO$ (y>x), or $Zn_{1-y}Mg_yO$ (y>x) and $Zn_{1-z}Mg_zO$ (z>x, with y and z being unequal to each other) are used for first and second barrier layers holding the active layer in between them, and any one of ZnS and BeO is used for barrier layers holding the active layer in between them.

2. The high-efficiency ultraviolet light-emitting device according to claim 1, characterized in that the value x is a value from 0.05 to 0.52.

3. The high-efficiency ultraviolet light-emitting device according to claim 2, characterized in that the value x is a value which is not smaller than 0.11.

4. A high-efficiency ultraviolet light-emitting device, characterized in that single-crystal $Zn_{1-z}Mg_xO$ (x>0) is used for an active layer and the active layer is a material having a property in which, when the value x is increased, a bandgap of the active layer is increased and light emission efficiency is increased at the same time.

5. A high-efficiency ultraviolet light-emitting device characterized in that single-crystal $Zn_{1-x}Mg_xO$ (x>0) is used for an active layer and any one of ZnS and BeO is used for barrier layers holding the active layer in between them.

6. The high-efficiency ultraviolet light-emitting device according to claim 5, characterized in that the value x is a value from 0.05 to 0.52.

7. The high-efficiency ultraviolet light-emitting device according to claim 4, characterized in that the value x is a value from 0.05 to 0.52.

8. The high-efficiency ultraviolet light-emitting device according to claim 6, characterized in that the value x is a value which is not smaller than 0.11.

9. The high-efficiency ultraviolet light-emitting device according to claim 7, characterized in that the value x is a value which is not smaller than 0.11.

10. The high-efficiency ultraviolet light-emitting device according to claim 3, characterized in that a light emission wavelength is not longer than 365 nm.

11. The high-efficiency ultraviolet light-emitting device according to claim 8, characterized in that a light emission wavelength is not longer than 365 nm.

12. The high-efficiency ultraviolet light-emitting device according to claim 9, characterized in that a light emission wavelength is not longer than 365 nm.

13. The high-efficiency ultraviolet light-emitting device according to claim 4, characterized in that decrease in light emission intensity with the increasing temperature becomes gentler as the value of x increases.

14. The high-efficiency ultraviolet light-emitting device according to claim 1, characterized in that any one of ZnS and BeO which are grown by radical-source molecular-beam epitaxy is used to form the barrier layers holding the active layer in between them.

15. The high-efficiency ultraviolet light-emitting device according to claim 5, characterized in that any one of ZnS and BeO which are grown by radical-source molecular-beam epitaxy is used to form the barrier layers holding the active layer in between them.

* * * * *

UNITED STATES PATENT AND TRADEMARK OFFICE
CERTIFICATE OF CORRECTION

| | | |
|---|---|---|
| PATENT NO. | : 8,304,804 B2 | Page 1 of 1 |
| APPLICATION NO. | : 12/601248 | |
| DATED | : November 6, 2012 | |
| INVENTOR(S) | : Hajime Shibata et al. | |

It is certified that error appears in the above-identified patent and that said Letters Patent is hereby corrected as shown below:

On Title Page, Column 2 (Abstract) Lines 4-5,
  delete "11/$Zn_{1-z}Mg_xO$" and insert --11/$Zn_{1-x}Mg_xO$--.

In the Claims:

At Column 7 Line 15, which is line 2 of claim 1,
  delete "$Zn_{1-z}Mg_xO$" and insert --$Zn_{1-x}Mg_xO$--.

At Column 7 Line 27, which is line 1 of claim 4,
  delete "device," and insert --device--.

At Column 7 Line 28, which is line 2 of claim 4,
  delete "$Zn_{1-z}Mg_xO$" and insert --$Zn_{1-x}Mg_xO$--.

Signed and Sealed this
Seventh Day of May, 2013

Teresa Stanek Rea
*Acting Director of the United States Patent and Trademark Office*